United States Patent
Yu et al.

(10) Patent No.: US 8,528,802 B2
(45) Date of Patent: Sep. 10, 2013

(54) APPARATUS AND METHOD OF SUBSTRATE TO SUBSTRATE BONDING FOR THREE DIMENSIONAL (3D) IC INTERCONNECTS

(75) Inventors: Chen-Hua Yu, Hsin-Chu (TW); Wen-Chih Chiou, Miaoli (TW); Weng-Jin Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 232 days.

(21) Appl. No.: 12/204,063

(22) Filed: Sep. 4, 2008

(65) Prior Publication Data

US 2010/0050423 A1    Mar. 4, 2010

(51) Int. Cl.
    *B23K 1/06*    (2006.01)
    *B23K 31/02*   (2006.01)

(52) U.S. Cl.
    USPC ......... 228/1.1; 228/110.1; 228/223; 439/455; 29/739

(58) Field of Classification Search
    USPC ............. 228/1.1, 110.1; 29/739; 438/455, 438/667
    See application file for complete search history.

(56) References Cited

U.S. PATENT DOCUMENTS

| 7,828,193 | B2 | 11/2010 | Ishikawa et al. |
| 8,104,668 | B2 * | 1/2012 | Gruber et al. ................. 228/228 |
| 2001/0048018 | A1 * | 12/2001 | Hembree et al. .......... 228/110.1 |
| 2002/0056740 | A1 | 5/2002 | Hayashi |
| 2003/0164394 | A1 * | 9/2003 | Suga et al. ..................... 228/1.1 |
| 2007/0111471 | A1 * | 5/2007 | Okada ........................... 438/455 |
| 2008/0203138 | A1 * | 8/2008 | Ishikawa et al. ........... 228/111.5 |
| 2009/0211709 | A1 * | 8/2009 | Choy et al. .................... 156/350 |

FOREIGN PATENT DOCUMENTS

| CN | 101197297 A | 6/2008 |
| CN | 101256972 A | 9/2008 |

OTHER PUBLICATIONS

Kim, J.; et al., "Ultrasonic Bonding of IN/AU and AL/AL for Hermetic Sealing of MEMS Packaging," 2002, IEEE, pp. 415-418.

\* cited by examiner

*Primary Examiner* — Devang R Patel
(74) *Attorney, Agent, or Firm* — Slater & Matsil, L.L.P.

(57) ABSTRACT

An apparatus including a bond head, a supplemental support, a reduction module, and a transducer is provided. The bond head holds a first substrate that contains a first set of metal pads. The supplemental support holds a second substrate that contains a second set of metal pads. The aligner forms an aligned set of metal pads by aligning the first substrate to the second substrate. The reduction module contains the aligned substrates and a reduction gas flows into the reduction module. The transducer provides repeated relative motion to the aligned set of metal pads.

19 Claims, 3 Drawing Sheets

APPARATUS AND METHOD OF SUBSTRATE TO SUBSTRATE BONDING FOR THREE DIMENSIONAL (3D) IC INTERCONNECTS

TECHNICAL FIELD

The present invention relates generally to an apparatus and a method of substrate to substrate bonding for a three dimensional interconnect and, in particular, to an apparatus and a method of direct metal bonding.

BACKGROUND

As the cost of shrinking semiconductor devices continues to increase, alternative approaches, such as extending the integration of circuits into the third dimension or semiconductor substrate stacking, are being explored. Two or more substrates are bonded together to form a three dimensional structure. Several bonding processes have been implemented for these structures.

Adhesive bonding and dielectric fusion bonding are bonding processes that bond dielectric layers together. Adhesive bonding and dielectric fusion bonding are typically used in processes that require further processing steps after bonding, such as through via etch processes. Conventional direct metal bonding is another method of bonding that bonds metal from one substrate to metal of another substrate. Many conventional direct metal bonding schemes employ solder balls.

Conventional direct metal bonding may cause structural and electrical defects when employed for Cu to Cu bonding on structures that comprise a low k dielectric. As semiconductor chips have scaled, the insulating dielectrics between metal layers have thinned to the point where charge build up and crosstalk adversely affect the performance of the device. Replacing silicon dioxide or like dielectric with a low k dielectric of the same thickness reduces parasitic capacitance, enabling faster switching speeds and lower heat dissipation. However, low k materials are typically porous materials that may not be as mechanically robust as traditional dielectrics.

In conventional direct metal to metal bonding, an additional plasma pre-treatment process may be used to remove surface oxide from the metal surfaces of substrate metal bond pads, in contrast to a less aggressive plasma pre-treatment found in conventional processing. The substrates may then be transferred to a bonding tool. In transferring the substrates, the metal bond pads are exposed to atmosphere. The surface oxides and contamination may begin to accumulate on the metal surfaces of the substrates. Further, the metal bond pads are exposed to atmosphere in the conventional bonding tool. The conventional bonding tool may require a high temperature such as 400° C. for 3D IC bonding. The bonding tool may also apply pressure to the substrates of up to about several psi, as ultrasonic bonding takes place.

A disadvantage of the conventional direct metal bonding is that an additional plasma pre-treatment may damage the device or low k material. Additionally, the relatively high temperature of the conventional bonding may further damage low k material. Damaged low k material may have a higher dielectric constant and thus result in higher RC delay for the 3D device.

A further disadvantage of the conventional direct metal bonding is that the surfaces of the metal pads may have a gap separating them that has a thickness of between about 20-40 µm in a solder ball process. Under the known direct solder bonding process the bonding environment is open to atmosphere, thus the metal pad or solder re-oxidizes in the atmosphere. The metal bond pads from each of the substrates are then bonded with the re-oxidation layers between them. This oxide and/or contamination layer may be porous and moisture may then corrode the metal pads, causing device reliability problems.

SUMMARY OF THE INVENTION

These and other problems are generally solved or circumvented, and technical advantages are generally achieved by an apparatus and method of substrate to substrate direct metal bonding for a three dimensional interconnect that employs an in situ reduction module.

In accordance with an illustrative embodiment, an apparatus including a bond head, a supplemental support, a reduction module, and a transducer is provided. The bond head holds a first substrate that contains a first set of metal pads. The supplemental support holds a second substrate that contains a second set of metal pads. The aligner forms an aligned set of metal pads by aligning the first set of metal pads to the second set of metal pads. The reduction module contains the aligned set of metal pads and a reduction gas flows into the reduction module. The transducer provides repeated relative motion to the aligned set of metal pads.

One advantage for an illustrative embodiment is that the bonding apparatus may require a lower bonding temperature than the conventional process of plasma pre-treatment followed by transport to a conventional bonding tool. Further, a less aggressive, therefore less damaging plasma pre-treatment is implemented. The undamaged low k materials will result in an improved RC delay time. Moreover, a reduced processing time, due to the lower temperature, may also be an advantage.

An additional advantage is that the gap of the two substrates of the resulting bonded metal pads may be reduced to less than about 5 µm, preferably less than about 1 µm. The benefit of reducing the gap to less than 5 µm is the reduction of moisture penetrating the gap material and corroding the metal pads. Further, a thinner gap may ease the complexity of further processing the bonded substrates.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

An advantage of an illustrative embodiment is that the illustrative embodiment provides a 3D IC with little or no low k damage, and a small gap thickness between the first and second substrate. The gap, according to an illustrative embodiment, may be between less than 1 μm to 5 μms.

Figure 1:
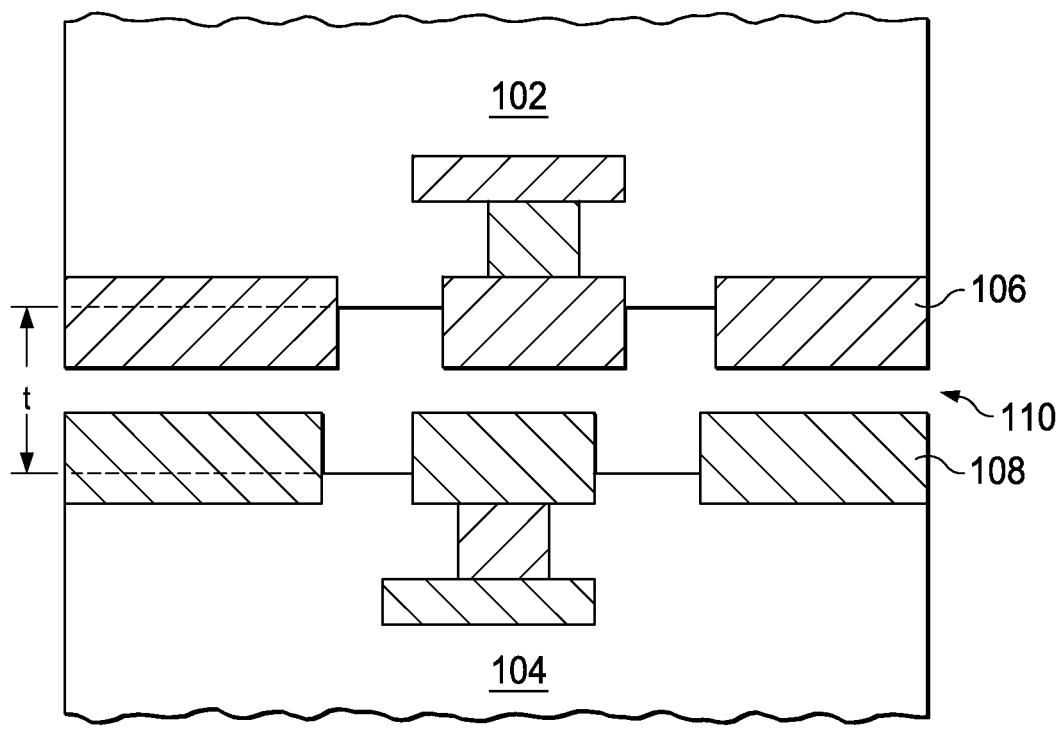
FIG. 1 is a cross sectional depiction of a three dimensional interconnect formed by a direct metal bonding process, in accordance with an illustrative embodiment.

FIG. 1 is a cross sectional depiction of a three dimensional semiconductor integrated circuit (3D IC) interconnect formed by a direct metal bonding process. In this example, first substrate 102 may be comprised of a semiconductor wafer, semiconductor die, other substrate, flip-chip, multiple substrates, or the like that may be bonded to a three dimensional interconnect structure. Second substrate 104 may be a semiconductor wafer, semiconductor die, other substrate, flip-chip, multiple substrates, or the like that may be bonded to a three dimensional interconnect structure. First substrate 102 and second substrate 104 may or may not be comprised of the same materials. Further, first substrate 102 and second substrate 104 may be comprised of any combination of semiconductor wafer, semiconductor chip, other substrates, flip-chips, multiple substrates, and the like. Either first substrate 102, second substrate 104 or both may include a layer or layers of low k dielectric, therefore may be vulnerable to high temperatures, high pressures, and aggressive plasma processes.

First substrate 102 includes first metal pad 106. Second substrate 104, includes second metal pad 108. Embodiments may include a plurality of first and second metal pads. Metal pads may comprise Cu, Sn, Au, In, Al, other metals, alloys, and the like. Gap 110 comprises the gap between first substrate 102 and second substrate 104. A thickness "t" of gap 110 comprises the distance between first substrate 102 and second substrate 104. A thickness "t" of gap 110 may be further comprised of the metal oxide and contamination layers between first metal pad 106 and second metal pad 108. According to one embodiment, the thickness "t" of gap 110 may be less than 5 μms. In a preferred embodiment, the thickness "t" of gap 110 may be less than 1 μm.

Figure 2:
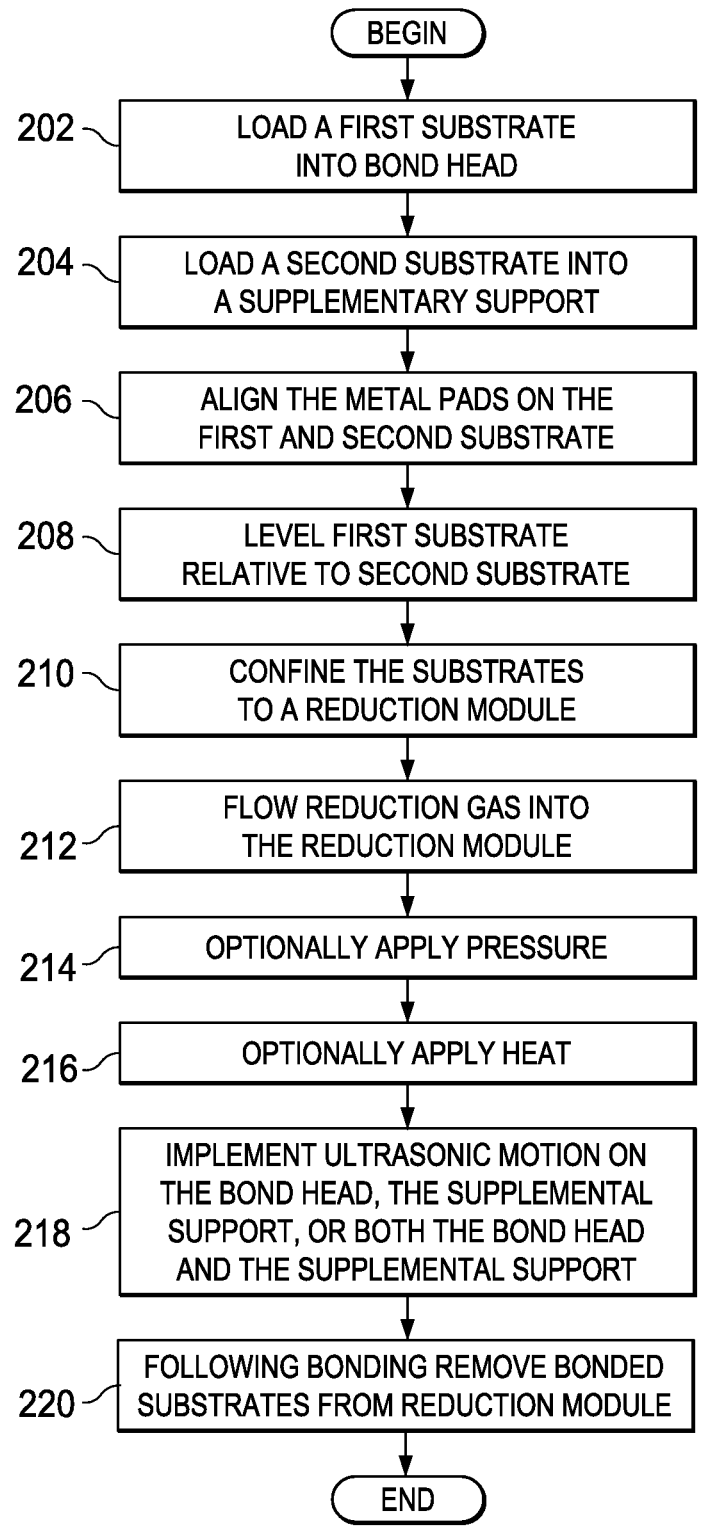
FIG. 2 is a flow chart of a method of substrate to substrate bonding for a three dimensional interconnect, in accordance with an illustrative embodiment.

FIG. 2 is a flow chart of a method of direct metal bonding for three dimensional interconnects, in accordance with an illustrative embodiment. The process begins by loading a first substrate, such as first substrate 102 in FIG. 1, into a bond head (step 202). Second substrate, such as second substrate 104 of FIG. 1, is loaded into a supplemental support (step 204). Both the first and the second substrates have at least one metal bond pad. The first and second substrates may be loaded, for example, manually, or with an automatic transfer mechanism, which may or may not include a die pick up holder system.

The metal pads to be bonded on the first and second substrate are aligned (step 206). An aligner system may be placed between the first and second substrates. The substrates may be aligned and then the aligner system moved from between the substrates. Aligner systems of various types are well known in the art and thus will not be discussed further herein.

The first substrate is then leveled with respect to the second substrate (step 208). This process ensures that a tilt across the substrates relative to each other is eliminated or minimized.

The substrates are confined in a reduction module throughout the duration of the bonding process (step 210). The reduction module may be at atmosphere or the reduction module may be under vacuum. Preferably the reduction module is brought to a vacuum of about 1-2 torr.

A reduction gas flows into the reduction module (step 212). As the reduction gas flows, the metal oxide that may have formed on the metal pads is substantially removed allowing direct metal to metal inter diffusion. The reduction gas may be $N_2+H_2$, $Ar+H_2$, $He+H_2$, $H_2$, HCOOH, or the like.

Optionally the leveler may cause pressure to be exerted to the aligned substrates through the bond head (step 214). The pressure may be between 1-100 psi. Higher pressures may damage low k dielectrics in one or both substrates.

Moreover, the bond head, the supplemental support, and/or both may cause the aligned substrates to be heated to a preferably uniform temperature (step 216). The temperature provided in this optional process will typically be less than the temperature in conventional bonding tools. The temperature may preferably be between about room temperature—400° C. Higher temperatures may damage low k dielectrics in one or both substrates.

Ultrasonic motion may be applied (step 218). The ultrasonic motion may be applied through the bond head, through the supplemental support, or through both the bond head and the supplemental support. It is termed "relative motion" when either or both the bond head and the supplemental support provide ultrasonic motion. In critical alignment processes, an embodiment may implement either a bond head or supplemental support ultrasonic motion. However, in many processes, the target alignment accuracy may be greater than 3 μm. Since there is more latitude in the target metal pad alignment, an embodiment may employ relative motion.

The aligned substrates remain in the reduction module throughout the bonding process. Following the bonding process, the substrates are removed from the reduction module (step 220). An advantage of this method is that the thickness of the gap, such as gap 110, in FIG. 1, between the substrates of the metal pads of the aligned substrates, may be significantly less than prior art processing.

Figure 3:
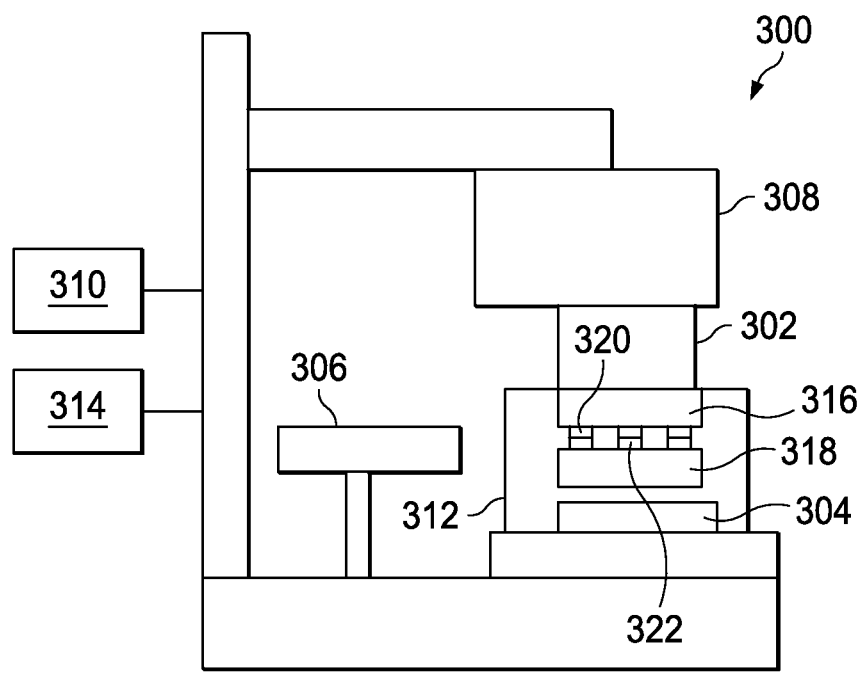
FIG. 3 is a depiction of select components of an apparatus for wafer bonding a three dimensional interconnect, in accordance with an illustrative embodiment.

FIG. 3 is an illustrative embodiment of an apparatus for bonding a three dimensional interconnect. The select components of bonding apparatus 300 are bond head 302, supplemental support 304, aligner 306, leveler 308, transducer 310, reduction module 312, and control unit 314. The configuration shown is an example configuration. As an example, in FIG. 3, bond head 302 and supplemental support 304 are shown with the bond head on top and supplemental support under bond head 302. However, in another embodiment the bond head and the supplemental support may be in other positions in bonding apparatus 300. Those of ordinary skill in the art will appreciate that the configuration of the illustrative features within an embodiment may be varied.

Bond head 302 holds a first substrate, such as first substrate 102 in FIG. 1. Bond head 302 may be configured to hold a semiconductor wafer, a portion of a semiconductor wafer, a semiconductor die, other substrate, a flip-chip, multiple substrates, or the like. Bond head 302 may be configured with heating capabilities to heat the aligned substrate. Further, transducer 310 may cause bond head 302 to deliver ultrasonic motion to the aligned substrate.

Leveler 308 is coupled to bond head 302. Leveler 308 includes a leveling system that levels the first substrate with respect to the second substrate. Leveling is important in 3D IC interconnects so that the final structure has a flat surface. Further, leveler 308 may be configured to exert a pressure on the aligned substrate. In an illustrative embodiment, leveler 308 may optionally be configured to exert pressures between about 1-100 psi on the aligned substrate.

Supplemental support 304 may be configured with features similar to bond head 302. Supplemental support 304 holds a second substrate, such as second substrate 104 in FIG. 1. Supplemental support 304 may be configured to hold a semiconductor wafer, a portion of a semiconductor wafer, a semiconductor die, other substrate, a flip-chip, multiple substrates, a die pick up holder system, or the like. Supplemental support 304 may be configured with heating capabilities to heat the aligned substrate. Further, transducer 310 may cause supplemental support 304 to deliver ultrasonic motion to the aligned substrate. Temperature may be introduced in the supplemental support. Preferred heating is about room temperature—400° C.

Transducer 310 causes an ultrasonic motion to be produced in the first substrate relative to the second substrate in bonding apparatus 300. In an embodiment, relative repetitive motion may be produced through bond head 302 and supplemental support 304.

Bonding apparatus 300 further has a control unit 314. Control unit 314 is configured to control the multiple aspects of bonding apparatus 300, including substrate loading and unloading, substrate leveling, temperature, pressure, vacuum, and ultrasonic parameters. Control unit 314 may comprise any type of microprocessor or the like.

The aligned substrates, 316 and 318, are enclosed in reduction module 312 and reduction gases are introduced to the aligned metal pads 322. Reduction module 312 may operate at atmospheric pressure or the ambient air may be depleted under a vacuum. Preferably, reduction module 312 is brought to vacuum of about 1-3 torr.

Figure 4:
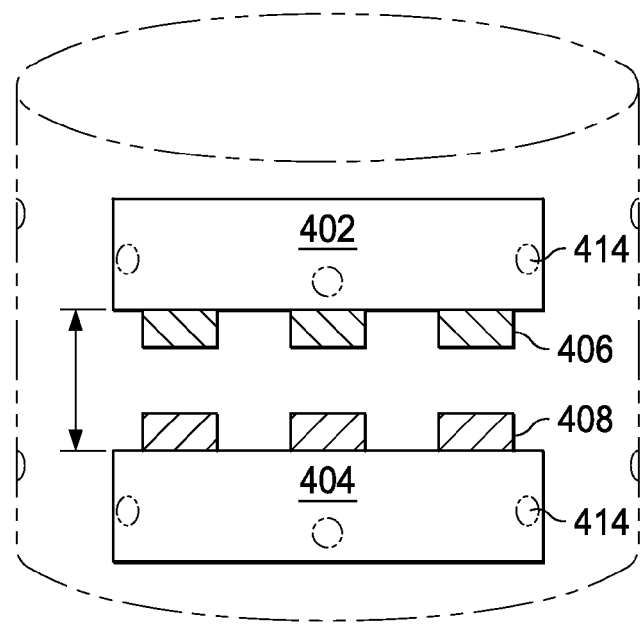
FIG. 4 is a side view of the in situ reduction module, in accordance with an illustrative embodiment.

FIG. 4 shows a more detailed look at a reduction module. Reduction module 400 is a reduction module such as reduction module 312 of FIG. 3. An in situ reduction module may be any shape that encloses the first and second substrates. Shown here, reduction module 400 is "can shaped." First substrate 402 and second substrate 404 are shown entirely enclosed by reduction module 400. In another embodiment, at least metal pads 406 and 408 are enclosed by reduction module 400. Reduction module 400 is shown with two rows of gas inlet holes 414 surrounding the module.

Figure 5:
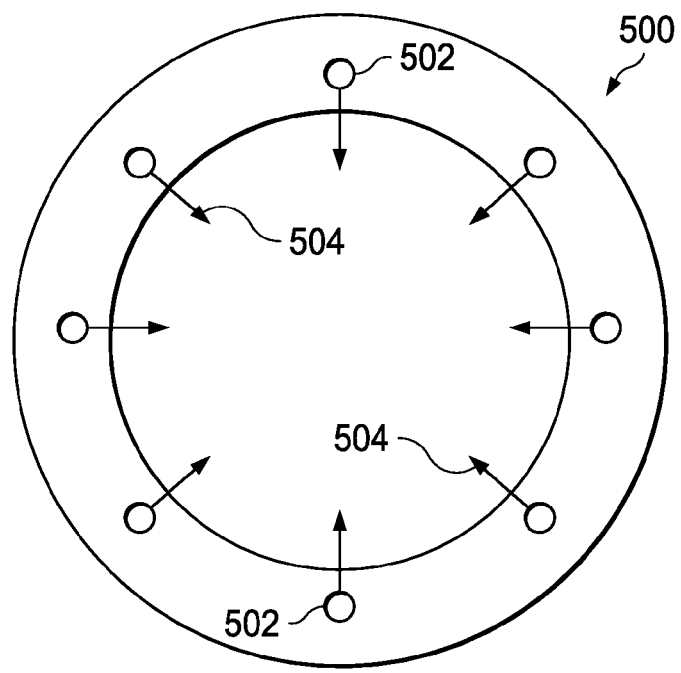
FIG. 5 is a top view of the in situ reduction module, in accordance with an illustrative embodiment.

FIG. 5 shows a top view of a reduction module, such as reduction module 312 in FIG. 3. Gas inlet holes 502 encircle reduction module 500. Reduction gas flows (depicted by arrows 504) into reduction module 500 immersing the aligned substrates (not shown). The reduction gas depletes or eliminates the metal oxide on the metal pad surfaces. An example of the way the reduction gas chemistry may work for the case of Cu metal bond pads and the reduction gas $H_2+N_2$ is as follows. The oxygen in the air combines with the Cu surface of the metal bond pads, forming metal oxide ($Cu+O_2 \rightarrow CuO_2$). The reduction gas $H_2+N_2$ is introduced to the metal surface and the 0 in the $CuO_2$ combines with the H2 in the reduction gas and forming $H_2O$ and depleting the metal oxide from the Cu surface (($Cu+$(reduction gas $H_2+N_2$) $\rightarrow Cu+H_2O$)). Thus, the clean Cu surfaces may bond (Cu+Cu may inter-diffuse→direct bonding).

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   a bond head to hold a first substrate, a first set of metal pads projecting from a surface of the first substrate, the first substrate comprising a first integrated circuit die;
   a supplemental support to hold a second substrate, a second set of metal pads projecting from a surface of the second substrate, the second substrate comprising a second integrated circuit die;
   an aligner to laterally align the first set of metal pads to the second set of metal pads, thereby forming an aligned set of metal pads;
   a leveler to vertically level the first substrate relative to the second substrate, thereby adjusting to reduce a tilt across facing surfaces of the first substrate and the second substrate, the bond head coupled directly to the leveler;
   a support holding the leveler and the bond head such that the leveler is disposed between the bond head and the support;
   a reduction module containing the aligned set of metal pads, and wherein the reduction module comprises a plurality of gas inlets coupled to a reduction gas source, the reduction gas source holding a reduction gas, the reduction gas being a gas suitable to remove metal oxide formed on the first set and the second set of metal pads to allow direct metal to metal inter diffusion; and
   a transducer to provide a repeated relative motion to the aligned set of metal pads while the first substrate and the second substrate are within about 5 μm of each other and after the first substrate is leveled by the leveler relative to the second substrate.

2. The apparatus of claim 1, wherein the leveler is configured to apply a pressure between about 1-100 psi to the aligned set of metal pads.

3. The apparatus of claim 1, wherein one or more of the bond head and the supplemental support are configured to provide heat to the aligned set of metal pads.

4. The apparatus of claim 3, wherein the heat applied is less than or equal to 400° C.

5. The apparatus of claim 1, wherein the repeated relative motion is an ultrasonic motion applied to at least one of the bond head, the supplemental support, or both the bond head and the supplemental support.

6. The apparatus of claim 1, wherein the reduction module is configured to entirely contain the first substrate and the second substrate during bonding.

7. The apparatus of claim 1, wherein the reduction gas is selected from the group consisting of N2+H2, Ar+H2, He+H2, H2, and HCOOH.

8. The apparatus of claim 1, wherein the first substrate comprises a wafer, and wherein the second substrate comprises a wafer.

9. The apparatus of claim 1, wherein the reduction module is configured to achieve a vacuum of about 1-3 Torr.

10. An apparatus comprising:
a reduction module to enclose an aligned set of metal pads on a first substrate and a second substrate, wherein the reduction module has a plurality of gas inlets coupled to a reduction gas source and receives a reduction gas flowed into the reduction module, thereby removing metal oxide formed on the set of metal pads to allow direct metal to metal inter diffusion;
a supplemental support to hold the second substrate, the supplemental support enclosed within the reduction module;
an aligner to align the set of metal pads on the first substrate and the second substrate, the aligner movable to a first movable position directly between the first substrate and the second substrate during alignment and to a second movable position outside of the reduction module during the removing;
a leveler to vertically adjust a tilt angle between opposing surfaces of the first substrate and the second substrate;
a bond head to hold the first substrate, the bond head directly connected to the leveler; and
a transducer to provide a repeated relative motion to the aligned set of metal pads within the reduction module, and wherein a gap between a resultant bonded first substrate and second substrate is less than or equal to about 5 µm.

11. The apparatus of claim 10 comprising:
a leveler configured to level the aligned set of metal pads, wherein the leveler is configured to apply about 1-100 psi of pressure to the aligned set of metal pads.

12. The apparatus of claim 10, wherein the reduction module is configured to achieve a vacuum of 1-3 Torr.

13. The apparatus of claim 10, wherein the reduction module is configured to receive a reduction gas selected from a group consisting of $N_2+H_2$, $Ar+H_2$, $He+H_2$, $H_2$, and HCOOH.

14. The apparatus of claim 10, wherein the reduction module includes at least one opening to surround the aligned set of metal pads with a uniform reduction gas flow.

15. The apparatus of claim 10 configured to heat the aligned set of metal pads while the aligned set of metal pads are within the reduction module, the temperature ranging from 0-400° C.

16. The apparatus of claim 10, wherein at least one of the first substrate and the second substrate contain a low-k dielectric region.

17. An apparatus comprising:
a bond head to hold a first substrate that includes a first set of metal pads;
a supplemental support to hold a second substrate that includes a second set of metal pads;
an aligner to align the first set of metal pads to the second set of metal pads, thereby forming an aligned set of metal pads, at least a portion of the aligner being movable to a position directly between the first set of metal pads and the second set of metal pads;
a leveler to vertically adjust a tilt between the first substrate and the second substrate the bond head coupled directly to the leveler;
a reduction module containing the aligned set of metal pads and the supplemental support, wherein the reduction module has a plurality of gas inlets coupled to a reduction gas source, the reduction gas source holding a reduction gas, the reduction gas suitable to remove metal oxide formed on the first set and the second set of metal pads to allow direct metal to metal inter diffusion; and
a transducer configured to provide a repeated relative motion to the aligned set of metal pads.

18. The apparatus of claim 17, wherein at least one of the first substrate and the second substrate comprise an at least one low-k dielectric region.

19. The apparatus of claim 1, wherein the supplemental support is disposed within the reduction module.

\* \* \* \* \*